(12) United States Patent
Kurayama (10) Patent No.: US 10,555,446 B2
(45) Date of Patent: Feb. 4, 2020

(54) FEEDER AND COMPONENT MOUNTING DEVICE

(71) Applicant: YAMAHA HATSUDOKI KABUSHIKI KAISHA, Iwata-shi, Shizuoka-ken (JP)

(72) Inventor: Tomoharu Kurayama, Iwata (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 0 days.

(21) Appl. No.: 15/780,512

(22) PCT Filed: Dec. 9, 2015

(86) PCT No.: PCT/JP2015/084580
§ 371 (c)(1),
(2) Date: May 31, 2018

(87) PCT Pub. No.: WO2017/098616
PCT Pub. Date: Jun. 15, 2017

(65) Prior Publication Data
US 2018/0359888 A1 Dec. 13, 2018

(51) Int. Cl.
*H05K 13/02* (2006.01)
*H05K 13/04* (2006.01)
(Continued)

(52) U.S. Cl.
CPC ......... *H05K 13/02* (2013.01); *B29C 65/7802* (2013.01); *B29C 66/93* (2013.01);
(Continued)

(58) Field of Classification Search
CPC ............. B65C 66/83411; H05K 13/02; H05K 13/0419; B65H 5/28; B29C 65/78; B29C 65/7802; B29C 66/90; B29C 66/93
(Continued)

(56) References Cited

U.S. PATENT DOCUMENTS 6,032,845 A * 3/2000 Piccone ................. B65H 20/22
226/139
2006/0162868 A1* 7/2006 Ricketson .......... H05K 13/0419
156/750

(Continued)

FOREIGN PATENT DOCUMENTS

CN 201794631 U 4/2011
CN 203864150 U 10/2014
(Continued)

OTHER PUBLICATIONS

English translation of JP2017-554723.*
(Continued)

*Primary Examiner* — Sonya M Sengupta
(74) *Attorney, Agent, or Firm* — Studebaker & Brackett PC (57) ABSTRACT

A feeder includes a first sprocket disposed downstream in a conveyance direction and including a first protrusion that engages with a carrier tape, a second sprocket disposed upstream in the conveyance direction, including a second protrusion that engages with the carrier tape, and that rotates in synchronization with the first sprocket, and a phase adjustment mechanism that adjusts a phase of the second sprocket around a rotation center of the second sprocket.

17 Claims, 7 Drawing Sheets

(51) Int. Cl.
  *B29C 65/78* (2006.01)
  *B65H 5/28* (2006.01)
  *B29C 65/00* (2006.01)
(52) U.S. Cl.
  CPC ........... *B65H 5/28* (2013.01); *H05K 13/0419* (2018.08); *B29C 65/78* (2013.01); *B29C 66/90* (2013.01)
(58) Field of Classification Search
  USPC ................................ 156/350, 361, 538, 556
  See application file for complete search history.

(56) References Cited

U.S. PATENT DOCUMENTS

| | | | | |
|---|---|---|---|---|
| 2012/0305620 | A1* | 12/2012 | Kinoshita | H05K 13/0419 226/1 |
| 2014/0063559 | A1 | 3/2014 | Raynor et al. | |
| 2014/0346212 | A1* | 11/2014 | Kawaguchi | H05K 13/0419 226/76 |
| 2015/0195964 | A1* | 7/2015 | Yamasaki | H05K 13/0419 226/76 |

FOREIGN PATENT DOCUMENTS

| | | |
|---|---|---|
| CN | 104488372 A | 4/2015 |
| JP | S49-109077 U | 9/1974 |
| JP | S60-077844 U | 5/1985 |
| JP | S63-177591 A | 7/1988 |
| JP | 2000-072216 A | 3/2000 |
| JP | 2014-011315 A | 1/2014 |
| JP | 2014-236027 A | 12/2014 |
| WO | 2014/192639 A1 | 12/2014 |
| WO | 2015/029122 A1 | 3/2015 |
| WO | 2015/029125 A1 | 3/2015 |

OTHER PUBLICATIONS

English translation of JP49109077.*
English translation of JP60077844.*
An Office Action mailed by the Japanese Patent Office dated Dec. 11, 2018, which corresponds to Japanese Patent Application No. 2017-554723 and is related to U.S. Appl. No. 15/780,512; with English translation.
International Search Report issued in PCT/JP2015/084580; dated Mar. 8, 2016.
Written Opinion issued in PCT/JP2015/084580; dated Mar. 8, 2016.
An Office Action mailed by the Japanese Patent Office dated Jun. 11, 2019, which corresponds to Japanese Patent Application No. 2017-554723 and is related to U.S. Appl. No. 15/780,512.
An Office Action mailed by the Chinese Patent Office dated Sep. 26, 2019, which corresponds to Chinese Patent Application No. 201580084835.2 and is related to U.S. Appl. No. 15/780,512.

* cited by examiner

FIG.9
COMPARATIVE EXAMPLE

FIG.10
COMPARATIVE EXAMPLE

FIG.11
COMPARATIVE EXAMPLE

FEEDER AND COMPONENT MOUNTING DEVICE

CROSS-REFERENCE TO RELATED APPLICATION

This application is a National Stage of International Patent Application No. PCT/JP2015/084580, filed Dec. 9, 2015, the entire content of which is incorporated herein by reference.

BACKGROUND

Technical Field

The present disclosure relates to a feeder and a component mounting device.

Background Art

In general, a feeder used in a component mounting device is known. Such a feeder is disclosed in Japanese Patent Laying-Open No. 2014-11315, for example. The aforementioned Japanese Patent Laying-Open No. 2014-11315 discloses a feeder that conveys a carrier tape including components in a predetermined conveyance direction. This feeder includes a first sprocket disposed downstream in the conveyance direction and a second sprocket disposed upstream in the conveyance direction. The carrier tape includes a plurality of holes engageable with each of the sprockets. The first sprocket includes first protrusions that engage with the carrier tape. The second sprocket includes second protrusions that engage with the carrier tape. The first sprocket and the second sprocket are configured to rotate synchronously.

The components are suctioned in the vicinity of the first sprocket. The first sprocket positions and conveys the carrier tape such that each of the components is properly suctioned at a suction position. Therefore, the second sprocket preferably does not come into contact with (no load is preferably applied to) the peripheral edge of each of the holes of the carrier tape in a state where a first protrusion of the first sprocket and a second protrusion of the second sprocket are fitted into the holes of the carrier tape. That is, the first sprocket preferably initiatively conveys the carrier tape. The carrier tape is formed such that a pitch between the adjacent holes in the carrier tape is within a predetermined error range with respect to a reference value.

SUMMARY

However, in the feeder disclosed in the aforementioned Japanese Patent Laying-Open No. 2014-11315, when the carrier tape engages with the first protrusion of the first sprocket and the second protrusion of the second sprocket, the second sprocket may come into contact with the carrier tape to apply a load to the carrier tape due to an error in the pitch between the adjacent holes in the carrier tape. Thus, the carrier tape is stretched or bent such that the carrier tape may not be properly conveyed.

The present disclosure provides a feeder and a component mounting device each capable of properly conveying a carrier tape while significantly reducing or preventing stretching or bending of the carrier tape.

A feeder according to a first aspect of the present disclosure is a feeder that conveys a carrier tape including a component in a predetermined conveyance direction, and includes a first sprocket disposed downstream in the conveyance direction and including a first protrusion that engages with the carrier tape, a second sprocket disposed upstream in the conveyance direction, including a second protrusion that engages with the carrier tape, and that rotates in synchronization with the first sprocket, and a phase adjustment mechanism that adjusts a phase of the second sprocket around a rotation center of the second sprocket.

As hereinabove described, the feeder according to the first aspect of the present disclosure includes the phase adjustment mechanism that adjusts the phase of the second sprocket around the rotation center. Thus, even when there is an error in a pitch between adjacent holes in the carrier tape, the phase (the position in a rotation direction) of the second sprocket is adjusted such that it is possible to significantly reduce or prevent application of a load to the carrier tape due to contact of the second sprocket with the carrier tape when the carrier tape engages with the first protrusion of the first sprocket and the second protrusion of the second sprocket. Consequently, it is possible to significantly reduce or prevent stretching or bending of the carrier tape, and hence the carrier tape can be properly conveyed.

In the aforementioned feeder according to the first aspect, in the conveyance direction, a width of the second protrusion of the second sprocket is preferably smaller than a width of the first protrusion of the first sprocket. According to this structure, the phase of the second sprocket including the second protrusion having a smaller width in the conveyance direction is adjusted such that it is possible to more easily significantly reduce or prevent contact of the second sprocket with the carrier tape as compared with the case where the widths of the first protrusion and the second protrusion are the same as each other.

In the aforementioned feeder according to the first aspect, the phase adjustment mechanism preferably includes a power transmission gear that transmits a drive force to the second sprocket, and the second sprocket is preferably rotationally movable with respect to the power transmission gear. According to this structure, the phase of the second sprocket can be easily changed simply by rotationally moving the second sprocket with respect to the power transmission gear.

In this case, the phase adjustment mechanism preferably includes a fixing plate, and the fixing plate is preferably fixed to the power transmission gear and preferably fixes the second sprocket such that the second sprocket is rotationally movable around the rotation center. According to this structure, unlike the case where the second sprocket is directly fixed to the power transmission gear, the second sprocket can be easily and phase-adjustably fixed using the fixing plate.

In the aforementioned structure in which the phase adjustment mechanism includes the fixing plate, the second sprocket is preferably disposed between the fixing plate and the power transmission gear. According to this structure, the second sprocket is not disposed away from the power transmission gear in a direction in which the second sprocket, the fixing plate, and the power transmission gear overlap each other. Thus, it is possible to significantly reduce or prevent a difference between a distance between the second sprocket and the power transmission gear and a distance between the first sprocket and a gear that transmits a drive force to the first sprocket. Consequently, it is possible to significantly reduce or prevent positional deviation of the first sprocket and the second sprocket in a direction perpendicular to the conveyance direction of the carrier tape, and hence the carrier tape can be easily conveyed.

In the aforementioned structure in which the second sprocket is disposed between the fixing plate and the power transmission gear, the power transmission gear preferably includes a rotating shaft serving as a rotation center of the power transmission gear, the second sprocket preferably includes a hole through which the rotating shaft of the power transmission gear passes, and the fixing plate is preferably fixed to the rotating shaft of the power transmission gear. According to this structure, the second sprocket can be disposed between the fixing plate and the power transmission gear while the rotation centers of the power transmission gear and the second sprocket easily coincide with each other.

In the aforementioned structure in which the phase adjustment mechanism includes the fixing plate, the fixing plate preferably includes a long hole having an elongated shape and circumferentially disposed, the second sprocket preferably includes a fastening hole circumferentially disposed, and the second sprocket is preferably rotationally movably fixed to the fixing plate by fastening a fastening member, which has passed through the long hole, to the fastening hole. According to this structure, the second sprocket can be rotationally movably fixed to the fixing plate along the long hole circumferentially disposed. Consequently, the rotation phase of the second sprocket with respect to the fixing plate can be easily adjusted. Even when the carrier tape is replaced, the position (rotation phase) of the second sprocket can be easily changed by loosening and tightening the fastening member.

In this case, the long hole preferably includes an arcuate hole. According to this structure, the second sprocket can be easily rotationally movably fixed. A component mounting device according to a second aspect of the present disclosure includes a feeder including a first sprocket disposed downstream in a conveyance direction in which a carrier tape including a component is conveyed and including a first protrusion that engages with the carrier tape, a second sprocket disposed upstream in the conveyance direction, including a second protrusion that engages with the carrier tape, and that rotates in synchronization with the first sprocket, and a phase adjustment mechanism that adjusts a phase of the second sprocket around a rotation center of the second sprocket, and a mounting portion that mounts the component on a mounting target.

As hereinabove described, the component mounting device according to the second aspect of the present disclosure includes the feeder including the phase adjustment mechanism that adjusts the phase of the second sprocket around the rotation center. Thus, even when there is an error in a pitch between adjacent holes in the carrier tape, the phase (the position in a rotation direction) of the second sprocket is adjusted such that it is possible to significantly reduce or prevent application of a load to the carrier tape due to contact of the second sprocket with the carrier tape when the carrier tape engages with the first protrusion of the first sprocket and the second protrusion of the second sprocket. Consequently, it is possible to significantly reduce or prevent stretching or bending of the carrier tape, and hence the carrier tape can be properly conveyed.

According to the present disclosure, as hereinabove described, the feeder and the component mounting device each capable of properly conveying the carrier tape while significantly reducing or preventing stretching or bending of the carrier tape can be provided.

DETAILED DESCRIPTION

An embodiment embodying the present disclosure is hereinafter described on the basis of the drawings.

(Structure of Component Mounting Device)

The structure of a component mounting device 100 according to the embodiment of the present disclosure is now described with reference to FIGS. 1 to 8.

Figure 1:
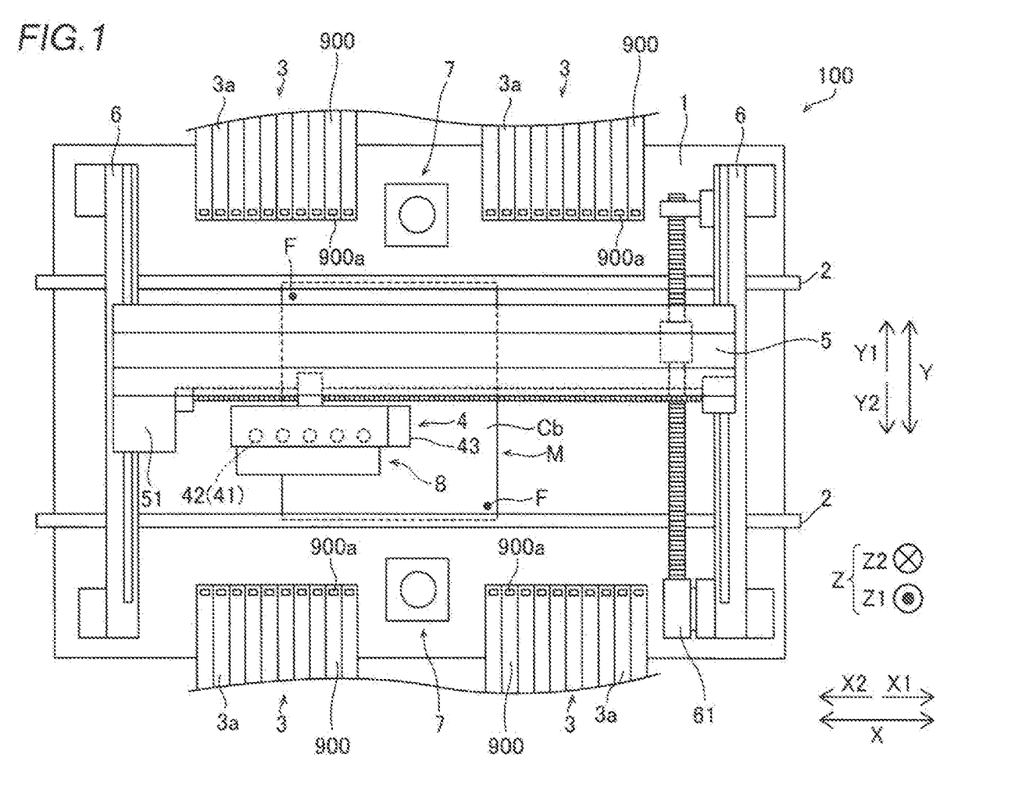
FIG. 1 is a diagram showing the overall structure of a component mounting device according to an embodiment of the present disclosure.

As shown in FIG. 1, the component mounting device 100 is a component mounting device that conveys a substrate Cb in a direction X by a pair of conveyors 2 and mounts components 900a on the substrate Cb at a mounting operation position M. The substrate Cb is an example of a "mounting target" in the claims. The direction X is the conveyance direction of the substrate Cb. A direction Y is a horizontal direction and a direction perpendicular to the conveyance direction of the substrate Cb.

The component mounting device 100 includes a base 1, the pair of conveyors 2, component feeders 3, and a head unit 4. The component mounting device 100 further includes a support 5, a pair of rails 6, component recognition imaging portions 7, and an imaging unit 8.

The pair of conveyors 2 are installed on the base 1 and are configured to convey the substrate Cb in the direction X. The pair of conveyors 2 are configured to hold the substrate Cb in a stopped state at the mounting operation position M. Moreover, the pair of conveyors 2 are configured such that an interval therebetween in the direction Y can be adjusted according to the dimensions of the substrate Cb.

The component feeders 3 are disposed outside (Y1 and Y2 sides) of the pair of conveyors 2. A plurality of feeders 3a are disposed in each of the component feeders 3. The feeders 3a are tape feeders configured to intermittently feed carrier tapes (hereinafter referred to as the tapes) 900 from reels (not shown) on which the tapes 900 that hold the components 900a are wound. The component feeders 3 are configured to feed the components 900a from the tips of the feeders 3a by conveying (feeding) the tapes 900 including the components 900a in a predetermined conveyance direction (direction T, see FIG. 3). The direction T is the conveyance direction of the tapes 900, and is a direction toward the suction positions of the feeders 3a.

Figure 2:
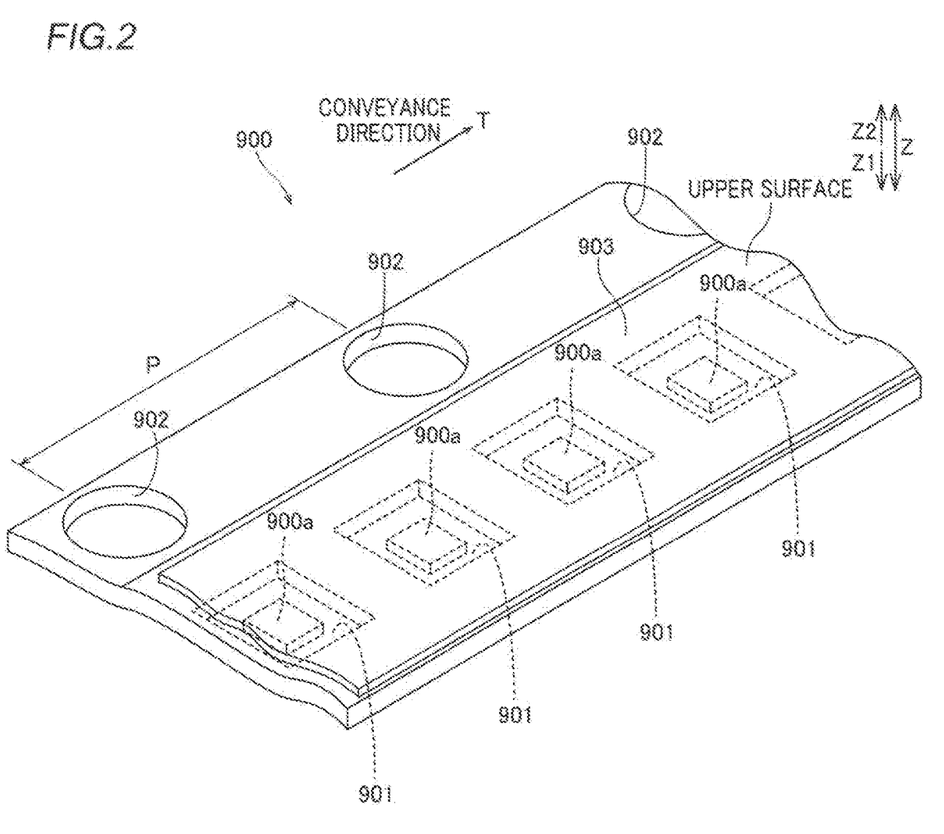
FIG. 2 is a diagram of a carrier tape disposed in a feeder according to the embodiment of the present disclosure.

As shown in FIG. 2, each of the tapes 900 includes a tape body provided with storages 901 and tape holes 902, and a film 903. The storages 901 are formed in a concave shape recessed from the upper surface of the tape 900 toward the lower surface thereof. The storages 901 are formed in a row shape at a predetermined interval. The components 900a are stored in the storages 901. Adjacent tape holes 902 are disposed at a predetermined interval (pitch P). There is an error in the pitch P between the adjacent tape holes 902. For example, according to the JIS standards, the tape holes 902 are provided so as to be within ±0.2 mm per 10 pitches (10×P). The film 903 covers the upper side of the storages 901 that store the components 900a. The components 900a are electronic components such as ICs, transistors, capacitors, and resistors. The feeders 3a are described later in detail.

As shown in FIG. 1, the head unit 4 is disposed above the pair of conveyors 2 and the component feeders 3. The head unit 4 includes a plurality of mounting heads 42 including nozzles 41 mounted at their lower ends and a substrate recognition camera 43. The mounting heads 42 are examples of a "mounting portion" in the claims.

The mounting heads 42 are configured to be movable up and down. The mounting heads 42 are configured to suction the components 900a fed from the feeders 3a by a negative pressure generated at the tips of the nozzles 41 by a negative pressure generator (not shown) and to mount the components 900a on the substrate Cb. The substrate recognition camera 43 is configured to image fiducial marks F of the substrate Cb in order to recognize the position of the substrate Cb.

The support 5 extends in the direction X. Both ends of the support 5 are supported by the pair of rails 6. The support 5 includes a motor 51. The support 5 is configured to move the head unit 4 in the direction X along the support 5 by driving the motor 51.

The pair of rails 6 are fixed on the base 1. A rail 6 on an X1 side includes a motor 61. The rails 6 are configured to move the support 5 in the direction Y perpendicular to the direction X along the pair of rails 6 by driving the motor 61. The head unit 4 is movable to an arbitrary position in the horizontal direction by the support 5 and the rails 6.

The component recognition imaging portions 7 are fixed on the upper surface of the base 1. A pair of component recognition imaging portions 7 are provided. The component recognition imaging portions 7 are configured to image the components 900a suctioned by the nozzles 41 of the mounting heads 42 from the lower side (Z2 side) in order to recognize the suction states of the components 900a prior to mounting of the components 900a.

The imaging unit 8 is mounted on the head unit 4. The imaging unit 8 is configured to move in the directions X and Y together with the head unit 4. The imaging unit 8 is configured to capture images of mounting positions and regions around the mounting positions before and after mounting for a determination of whether or not the components 900a have been normally mounted at the mounting positions and a determination of the mounting states of the components 900a around the mounting positions. The imaging unit 8 includes cameras and illuminators (not shown).

(Detailed Structure of Feeder)

Figure 3:
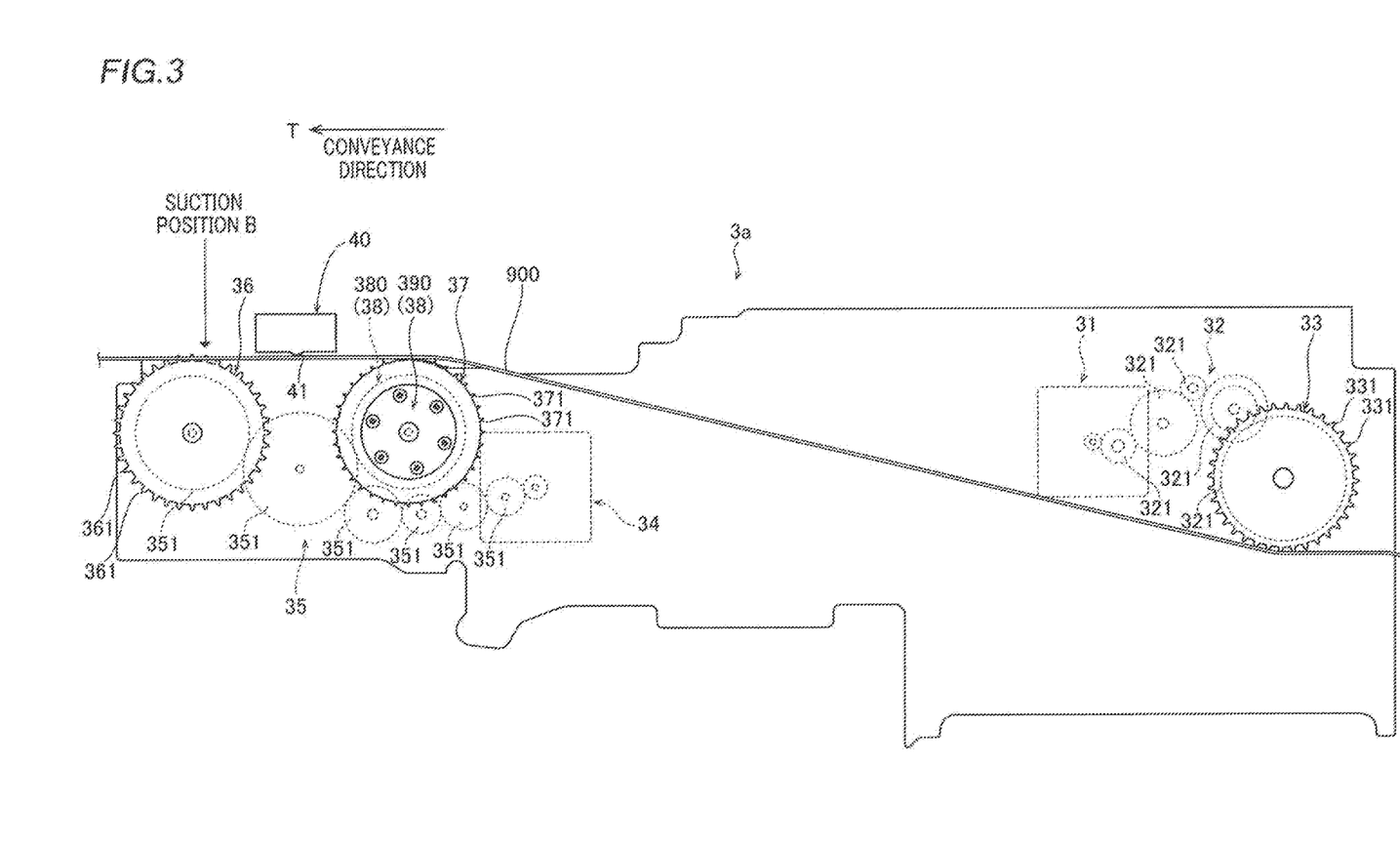
FIG. 3 is a schematic view of the feeder according to the embodiment of the present disclosure.

As shown in FIG. 3, each of the feeders 3a includes a drive 31, a drive transmission mechanism 32, and a sprocket 33. The feeder 3a further includes a drive 34, a drive transmission mechanism 35, a first sprocket 36, a second sprocket 37, and a phase adjustment mechanism 38. The phase adjustment mechanism 38 includes a power transmission gear 380 and a fixing plate 390. The feeder 3a further includes a component exposure portion 40. In FIG. 3, the components 900a on the tape 900 are omitted for the convenience of illustration.

The drive 31 includes a motor. The drive transmission mechanism 32 includes a plurality of gears 321. The drive transmission mechanism 32 is configured to transmit the drive force of the drive 31 to the sprocket 33.

The sprocket 33 is a gear-like member including a plurality of protrusions 331. The sprocket 33 is configured to convey the tape 900 in a direction (direction T) toward the second sprocket 37 and the first sprocket 36 by rotating in a state where a protrusion 331 engages with a tape hole 902 of the tape 900.

The drive 34 includes a motor. The drive transmission mechanism 35 includes a plurality of gears 351. The drive transmission mechanism 35 is configured to transmit the drive force of the drive 34 to the first sprocket 36 and the second sprocket 37. The second sprocket 37 and the first sprocket 36 can be synchronously rotated by the drive transmission mechanism 35.

Figure 4:
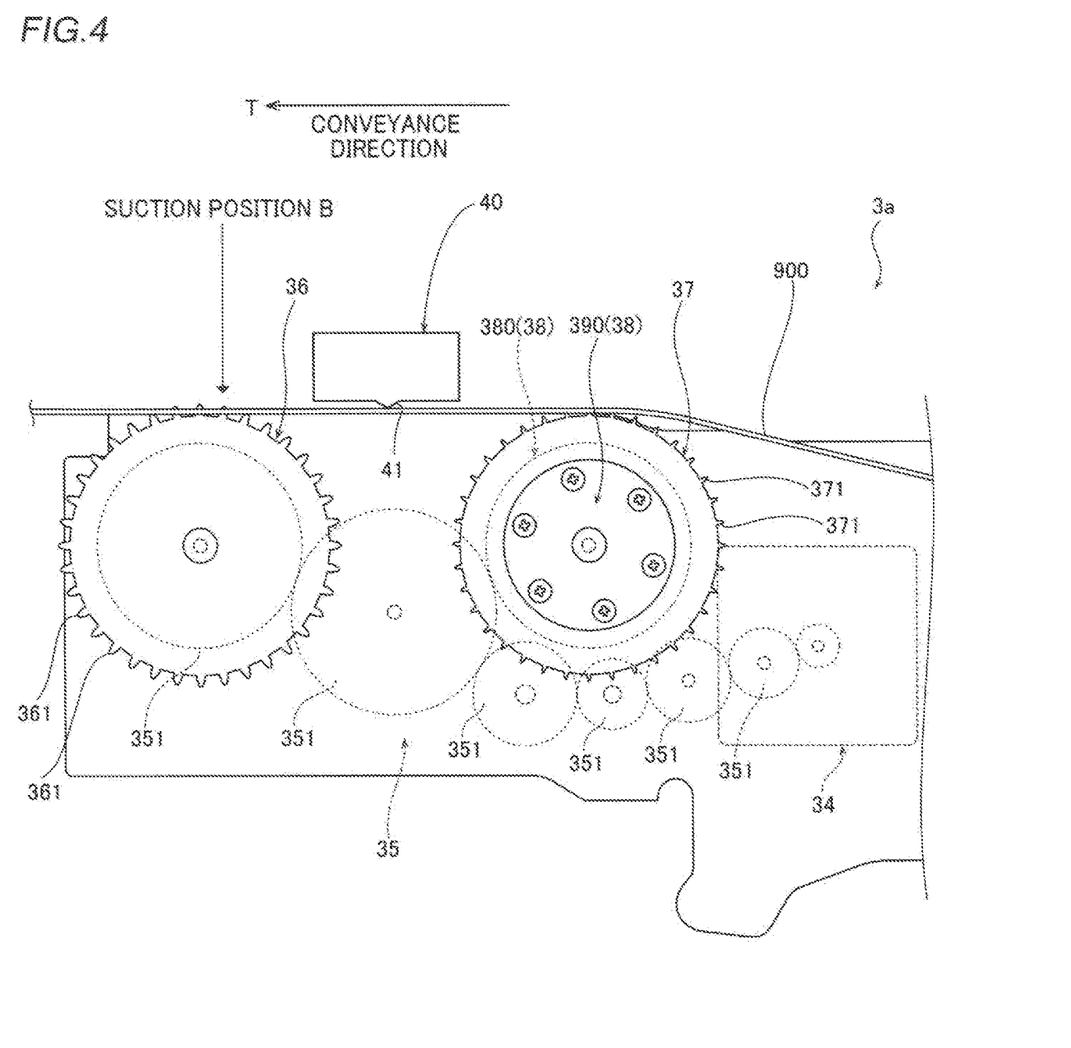
FIG. 4 is an enlarged view of a first sprocket and a second sprocket of the feeder according to the embodiment of the present disclosure.

As shown in FIG. 4, the first sprocket 36 is disposed downstream of the second sprocket 37 in the conveyance direction (direction T). The first sprocket 36 includes first protrusions 361 that engage with the tape 900 (the tape holes 902). The first sprocket 36 is a gear-like member including a plurality of first protrusions 361 provided along its circumference. The first sprocket 36 initiatively conveys the tape 900 in a state where all of the sprocket 33, the second sprocket 37, and the first sprocket 36 engage with the tape 900 (tape holes 902). Specifically, while the first protrusions 361 come into contact with downstream positions of the tape holes 902 in the conveyance direction (direction T) (while positioning the tape 900), the first sprocket 36 conveys the tape 900 such that each of the components is properly suctioned at a predetermined suction position B.

Thus, each of the components 900a on the tape 900 is suctioned at the suction position B in the vicinity of the first sprocket 36. In FIG. 4, the components 900a on the tape 900 are omitted for the convenience of illustration. The first protrusions 361 of the first sprocket 36 include tapered tips, and the tips of the first protrusions 361 are rounded. The first protrusions 361 each have a bullet-like vertical sectional shape (see FIG. 5), for example. The first protrusions 361 each have a square horizontal sectional shape (see FIG. 8) in which the four corners are chamfered, for example.

Figure 5:
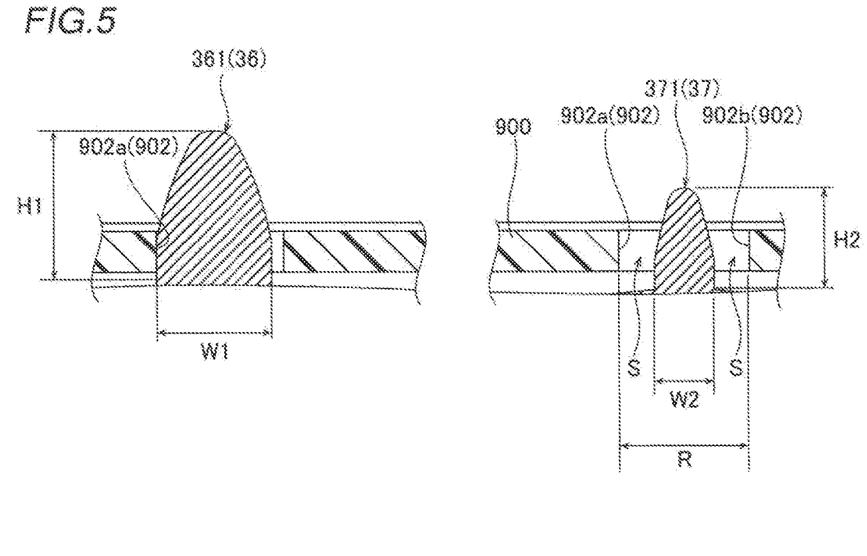
FIG. 5 is a vertical sectional view showing the carrier tape that engages with the first sprocket and the second sprocket of the feeder according to the embodiment of the present disclosure.

The second sprocket 37 is disposed upstream of the first sprocket 36 in the conveyance direction (direction T). The second sprocket 37 includes second protrusions 371 that engage with the tape 900 (tape holes 902). The second sprocket 37 is a gear-like member including a plurality of second protrusions 371 provided along its circumference. As shown in FIG. 5, the width W2 of each of the second protrusions 371 of the second sprocket 37 is smaller than the width W1 of each of the first protrusions 361 of the first sprocket 36 in the conveyance direction (direction T).

The second sprocket 37 (second protrusions 371) includes tapered tips. The tips of the second protrusions 371 are rounded. The height H2 of the second protrusion 371 is smaller than the height H1 of the first protrusion 361. The second protrusion 371 has a bullet-like vertical sectional shape, for example. The second protrusion 371 has a rectangular horizontal sectional shape (see FIG. 8), for example.

At the height position of the lower surface of the tape 900, the width W2 of the second protrusion 371 of the second sprocket 37 in the conveyance direction is about 40% of the inner diameter R of the tape hole 902, for example. The horizontal sectional area of the second protrusion 371 along the lower surface (i.e. the tape traveling surface) of the tape 900 is about 35% of the area of the tape hole 902, for example. The second protrusion 371 can be formed such that the horizontal sectional area thereof along the lower surface of the tape 900 is within a range of 30% to 60% of the area of the tape hole 902. In other words, a portion (space S) other than the second protrusion 371 in the horizontal section of the tape hole 902 is about 65% of the area of the tape hole 902. The second protrusion 371 can be formed such that the portion other than the second protrusion 371 in the horizontal section of the tape hole 902 is within a range of 40% to 70% of the area of the tape hole 902.

In consideration of at least (1) ensuring the strength of the second protrusion 371 and (2) allowing the tape 900 to properly engage with the first sprocket 37 when a state where the tape 900 does not engage with the first sprocket 37 but engages with the second sprocket 37 shifts to a state where the tape 900 engages with the first sprocket 37 and the second sprocket 37 after the tape 900 is inserted into the feeder 3a, the shape of the second protrusion 371 of the second sprocket 37 can be determined.

As shown in FIG. 4, the component exposure portion 40 includes a cutter (blade) 41. The component exposure portion 40 is provided between the first sprocket 36 and the second sprocket 37 in the conveyance direction (direction T). When the tape 900 is conveyed in the conveyance direction, the film 903 of the tape 900 comes into contact with the cutter 41 of the component exposure portion 40. The cutter 41 of the component exposure portion 40 comes into contact with a central portion of the tape 900 in a direction perpendicular to the conveyance direction. Thus, at the central portion of the tape 900 in the direction perpendicular to the conveyance direction, the film 903 is torn along a straight line in the conveyance direction of the tape 900 and further turned to both sides perpendicular to the tape conveyance direction, and the components 900a are exposed on the upper surface. At this time, the torn film 903 is in contact with both ends of the tape 900 in the horizontal direction perpendicular to the conveyance direction. Thus, the components 900a exposed on the upper surface of the tape 900 are suctioned at the suction position B.

Figure 6:
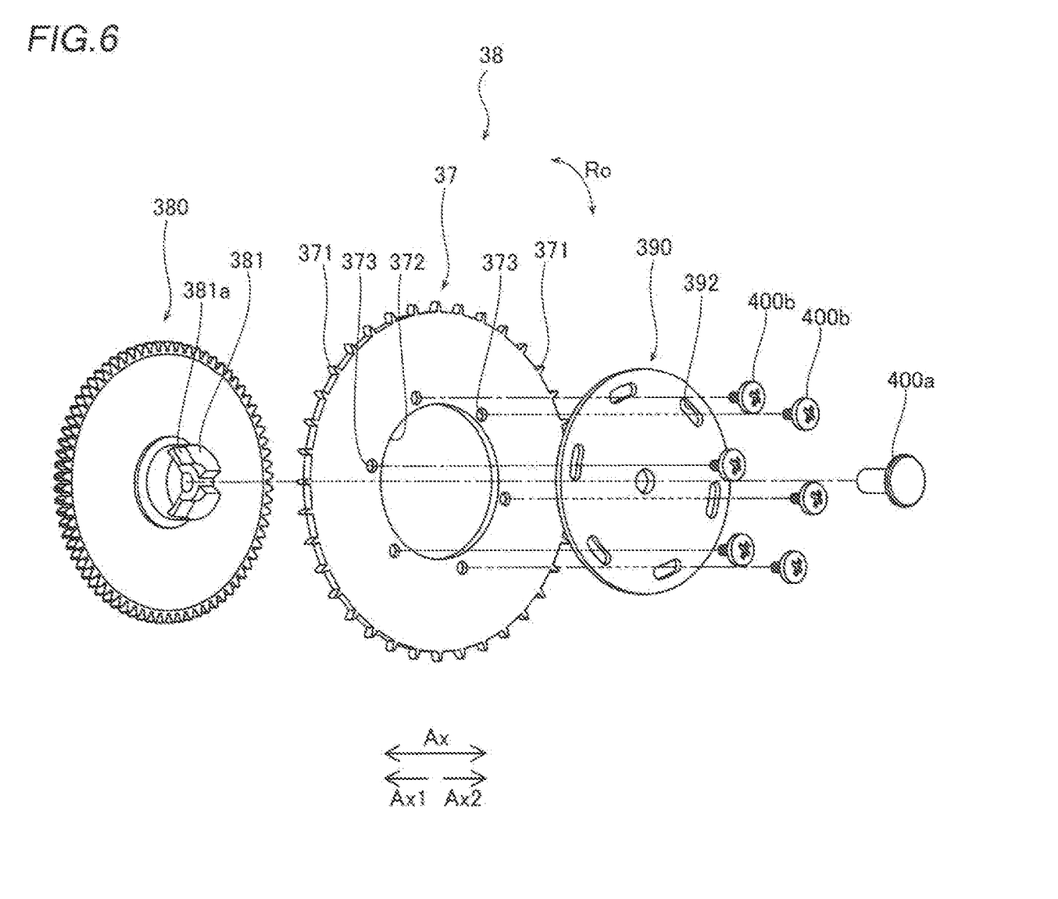
FIG. 6 is a diagram showing a phase adjustment mechanism of the feeder according to the embodiment of the present disclosure.

As shown in FIG. 6, the second sprocket 37 includes a hole 372 provided at its center and fastening holes 373 disposed along its circumference.

(Structure of Phase Adjustment Mechanism)

As shown in FIG. 6, the phase adjustment mechanism 38 includes the power transmission gear 380, the fixing plate 390, and fastening members 400a and 400b. The second sprocket 37 is sandwiched between the fixing plate 390 and the power transmission gear 380. The power transmission gear 380 is a gear that transmits power to the second sprocket 37. The phase adjustment mechanism 38 is configured to be capable of adjusting the phase of the second sprocket 37 around the rotation center of the second sprocket 37.

The power transmission gear 380 is configured to transmit the drive force to the second sprocket 37. The power transmission gear 380 includes a rotating shaft 381 serving as its rotation center. The rotating shaft 381 protrudes in the thickness direction (direction Ax2) of the power transmission gear 380. The rotating shaft 381 is provided with engagement portions 381a. The engagement portions 381a are recesses, for example, and a plurality of engagement portions 381a are provided radially from the rotation center of the power transmission gear 380. The rotating shaft 381 is disposed in the hole 372 so as to pass through the hole 372 of the second sprocket 37.

Figure 7:
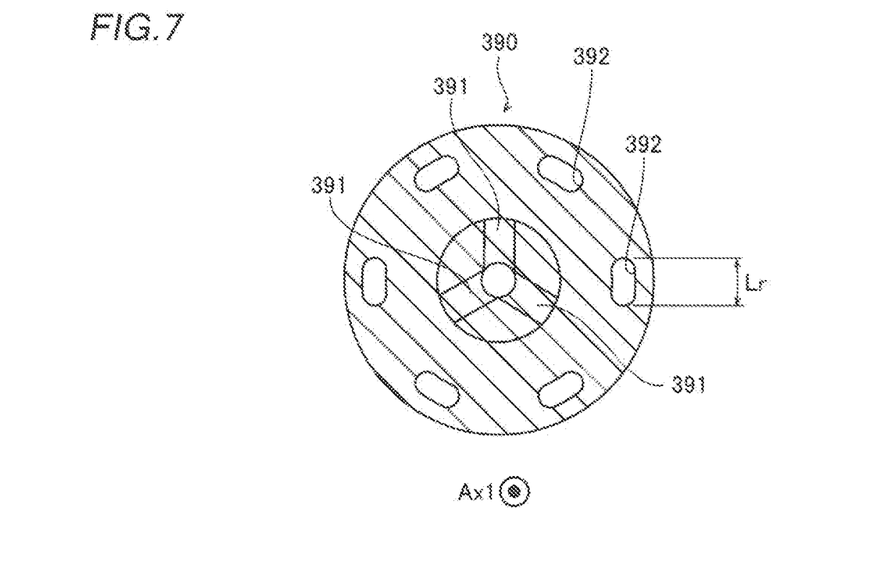
FIG. 7 is a diagram showing engagement portions of a fixing plate of the feeder according to the embodiment of the present disclosure.

The fixing plate 390 is fixed to the power transmission gear 380. The fixing plate 390 is a disk-like plate material. The fixing plate 390 includes engagement portions 391 on its one surface. The engagement portions 391 are a plurality of projections (see FIG. 7) provided radially from the rotation center of the fixing plate 390, for example. The engagement portions 391 are configured to engage with the engagement portions 381a of the power transmission gear 380. The fixing plate 390 is fixed to the rotating shaft 381 of the power transmission gear 380 in a state where the engagement portions 391 and the engagement portions 381a of the power transmission gear 380 engage with each other. The fixing plate 390 is fixed to the power transmission gear 380 (rotating shaft 381) by the fastening member 400a. Therefore, the fixing plate 390 and the power transmission gear 380 are fixed so as not to move relative to each other in a rotation direction around the rotating shaft 381 of the power transmission gear 380. Note that FIG. 7 is a diagram showing the fixing plate 390 alone as viewed from the side in a direction Ax1, and for the convenience of illustration, portions other than long holes 392 and a central hole are hatched.

The fixing plate 390 includes the long holes 392 circumferentially disposed. The long holes 392 include arcuate holes. The long holes 392 are holes each having a shape roughly along the circumference (outer circumference) direction of the fixing plate 390.

The fixing plate 390 is configured to fix the second sprocket 37 such that the second sprocket 37 is rotationally movable around its rotation center. Specifically, the second sprocket 37 is rotationally movably fixed to the fixing plate 390 by fastening the fastening members 400b, which have passed through the long holes 392 of the fixing plate 390, to the fastening holes 373. The long holes 392 extend in the circumference direction (within a range of a length Lr, see FIG. 7), and hence the second sprocket 37 can be fixed to the fixing plate 390 while the rotation phase of the second sprocket 37 with respect to the power transmission gear 380 (fixing plate 390) is adjusted. Specifically, the rotation phase of the second sprocket 37 with respect to the power transmission gear 380 (fixing plate 390) can be adjusted in a direction Ro shown in FIG. 6. Thus, the second sprocket 37 is configured to be rotationally movable with respect to the power transmission gear 380 (fixing plate 390), and can be fixed at an appropriate rotation phase position with respect to the power transmission gear 380 (fixing plate 390). After being adjusted to the appropriate rotation phase position, the second sprocket 37 is fixed by the fastening members 400b so as not to rotate relative to the fixing plate 390. The fixing plate 390 is fixed to the power transmission gear 380 by the fastening member 400a. As the fastening members 400a and 400b, screws or the like can be used, for example.

(Description of Engagement States Between Sprockets and Tape Holes)

Engagement states between the first and second sprockets 36 and 37 and the tape holes 902 are described with reference to FIGS. 5 and 8.

Figure 8:
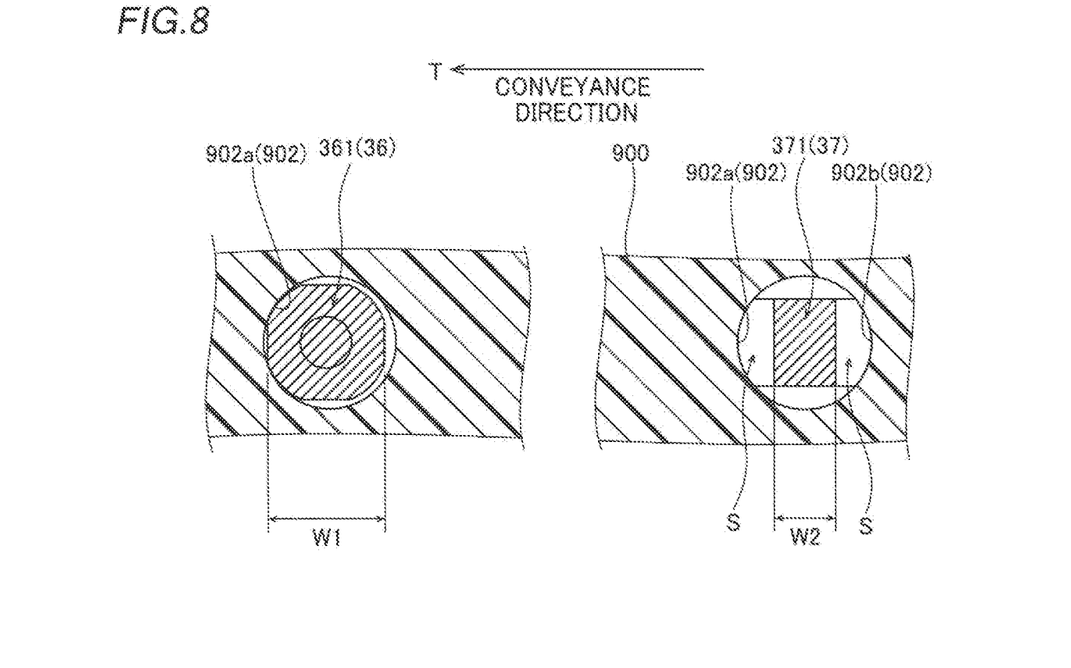
FIG. 8 is a plan view showing the carrier tape that engages with the first sprocket and the second sprocket of the feeder according to the embodiment of the present disclosure.

FIGS. 5 and 8 are views showing a state where the tape 900 is being conveyed while engaging with the second sprocket 37 and the first sprocket 36. The first sprocket 36 conveys the tape 900 such that the components are properly suctioned at the predetermined suction position B while the first protrusion 361 comes into contact with a downstream position 902a of the tape hole 902 in the conveyance direction (direction T) (while positioning the tape 900). The width W2 of the second protrusion 371 of the second sprocket 37 is smaller than the width W1 of the first protrusion 361 of the first sprocket 36, and hence the space S is ensured between the second protrusion 371 and the edge of the tape hole 902 (a downstream position 902a or upstream position 902b of the tape hole 902 in the conveyance direction). Thus, even when there is an error in the pitch P between the adjacent tape holes 902, it is possible to significantly reduce or prevent contact of the second protrusion 371 with the edge of the tape hole 902, and hence the second protrusion 371 does not apply a load to the tape 900. Consequently, it is possible to significantly reduce or prevent failure to properly convey the tape 900 due to stretching or bending of the tape 900.

According to the present embodiment, the feeder 3a includes the phase adjustment mechanism 38 such that even when a distance between the first sprocket 36 and the second sprocket 37 in the conveyance direction (direction T) deviates from a designed value (even when there is a dimensional error when the first sprocket 36 and the second sprocket 37 are disposed in the feeder 3a), the phase adjustment mechanism 38 can absorb the dimensional error in the feeder 3a and adjust the phase of the second sprocket 37 to the integral multiple of the pitch P between the tape holes 902. That is, the assembly errors of the first sprocket 36 and the second sprocket 37 in the feeder 3a are absorbed by the phase position, and the second protrusion 371 of the second sprocket 37 can be positioned near the center of the tape hole 902 (a position where the second protrusion 371 does not come into contact with the edge of the tape hole 902).

Effects of Present Embodiment

According to the present embodiment, the following effects can be obtained.

According to the present embodiment, as hereinabove described, the feeder 3a includes the phase adjustment mechanism 38 that adjusts the phase of the second sprocket 37 around the rotation center of the second sprocket 37. Thus, even when there is an error in the pitch P between the adjacent holes in the tape 900, the phase (the position in the rotation direction) of the second sprocket 37 is adjusted such that it is possible to significantly reduce or prevent application of a load to the tape 900 due to contact of the second sprocket 37 with the tape 900 when the tape 900 engages with the first protrusion 361 of the first sprocket 36 and the second protrusion 371 of the second sprocket 37. Consequently, it is possible to significantly reduce or prevent stretching or bending of the tape 900, and hence the tape 900 can be properly conveyed.

According to the present embodiment, in the conveyance direction (direction T), the width of the second protrusion 371 of the second sprocket 37 is smaller than the width of the first protrusion 361 of the first sprocket 36. Thus, the phase of the second sprocket 37 including the second protrusions 371 each having a smaller width in the conveyance direction (direction T) is adjusted such that it is possible to more easily significantly reduce or prevent contact of the second sprocket 37 with the tape 900 as compared with the case where the widths of the first protrusion 361 and the second protrusion 371 are the same as each other. The width of the second protrusion 371 is smaller than that of the first protrusion 361 such that gaps can be formed between the second protrusion 371 and the inner wall surface of the tape hole (sprocket hole) 902 on the front and rear sides in the conveyance direction. When the pitch P between the tape holes 902 is in accordance with a median of the standard, it is preferable to adjust the second protrusion 371 so as to be positioned at a central portion of the tape hole 902 in a state where the tape 900 is located at a position where the first protrusion 361 of the first sprocket 36 is fitted in the tape hole 902 (the position 902a where the first protrusion 361 is in contact with the inner wall surface of the tape hole 902 on the downstream side in the tape conveyance direction). The second protrusion 371 is adjusted in this manner such that equal gaps can be formed on both sides in the tape hole 902 when the pitch P is in accordance with the median of the standard, and even a situation in which the pitch P is larger than or smaller than the median of the standard to some extent depending on the tape 900 can be addressed. That is, even when variations in the pitch P are in a plus direction or a minus direction from the median of the standard value to some extent, the second protrusion 371 of the second sprocket 37 can be prevented from coming into contact with the tape 900 when the tape 900 is being conveyed by the first sprocket 36. Furthermore, when the pitch P tends to be biased to either the side larger than or the side smaller than the median of the standard value, in accordance with such a value, the sizes of the gaps in the tape hole 902 may be changed in the front and rear of the second protrusion 371.

According to the present embodiment, the power transmission gear 380 that transmits the drive force to the second sprocket 37 is provided in the phase adjustment mechanism 38. The second sprocket 37 is rotationally movable with respect to the power transmission gear 380. Thus, the phase of the second sprocket 37 can be easily changed simply by rotationally moving the second sprocket 37 with respect to the power transmission gear 380.

According to the present embodiment, the fixing plate 390 is provided in the phase adjustment mechanism 38. The fixing plate 390 is fixed to the power transmission gear 380 and fixes the second sprocket 37 such that second sprocket 37 is rotationally movable around its rotation center. Thus, unlike the case where the second sprocket 37 is directly fixed to the power transmission gear 380, the second sprocket 37 can be easily and phase-adjustably fixed using the fixing plate 390.

According to the present embodiment, the second sprocket 37 is disposed between the fixing plate 390 and the power transmission gear 380. Thus, the second sprocket 37 is not disposed away from the power transmission gear 380 in a direction in which the second sprocket 37, the fixing plate 390, and the power transmission gear 380 overlap each other. Thus, it is possible to significantly reduce or prevent a difference between a distance between the second sprocket 37 and the power transmission gear 380 and a distance between the first sprocket 36 and a gear that transmits a drive force to the first sprocket 36. Consequently, it is possible to significantly reduce or prevent positional deviation of the first sprocket 36 and the second sprocket 37 in the direction perpendicular to the conveyance direction of the tape 900, and hence the tape 900 can be easily conveyed.

According to the present embodiment, the rotating shaft 381 serving as the rotation center is provided on the power transmission gear 380. The second sprocket 37 includes the hole 372 through which the rotating shaft 381 of the power transmission gear 380 passes. The fixing plate 390 is fixed to the rotating shaft 381 of the power transmission gear 380. Thus, the second sprocket 37 can be disposed between the fixing plate 390 and the power transmission gear 380 while the rotation centers of the power transmission gear 380 and the second sprocket 37 easily coincide with each other.

According to the present embodiment, the fixing plate 390 includes the long holes 392 having an elongated shape and circumferentially disposed. The second sprocket 37 includes the fastening holes 373 circumferentially disposed. The second sprocket 37 is rotationally movably fixed to the fixing plate 390 by fastening the fastening members 400b, which have passed through the long holes 392, to the fastening holes 373. Thus, the second sprocket 37 can be rotationally movably fixed to the fixing plate 390 along the long holes 392 circumferentially disposed. Consequently, the rotation phase of the second sprocket 37 with respect to the fixing plate 390 can be easily adjusted. Even when the tape 900 is replaced, the position (rotation phase) of the second sprocket 37 can be easily changed by loosening and tightening the fastening members 400b.

According to the present embodiment, the long holes 392 are arcuate holes. Thus, the second sprocket 37 can be easily rotationally movably fixed.

The effects of the present embodiment are now described using the structure of a comparative example (see FIGS. 9 to 11) and the structure of the present embodiment (see FIG. 8).

Description of Comparative Example

Figure 9:
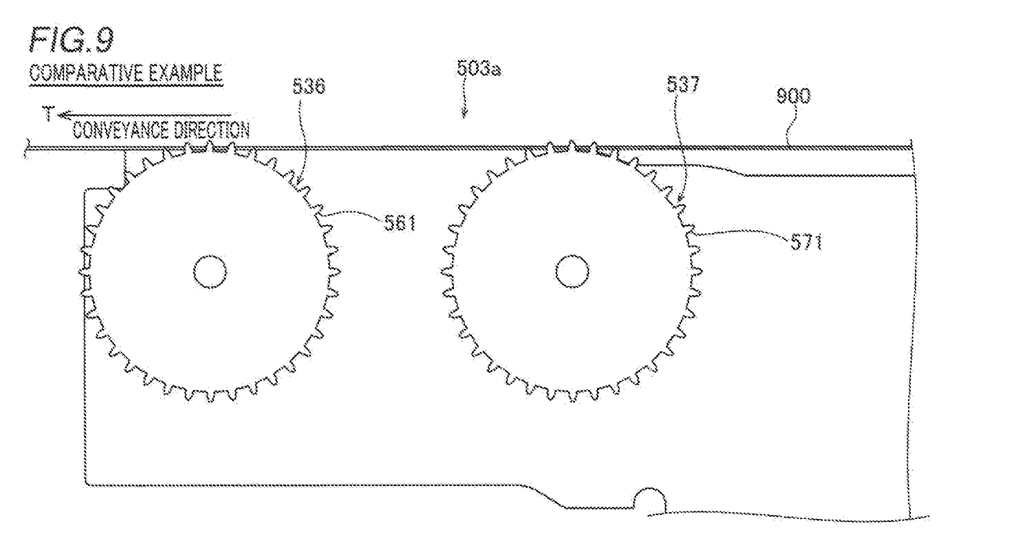
FIG. 9 is an enlarged view of a first sprocket and a second sprocket of a feeder according to a comparative example.

A feeder 503a of the comparative example shown in FIG. 9 includes a second sprocket 537 not including a phase adjustment mechanism but having the same shape as a first sprocket 536.

Figure 10:
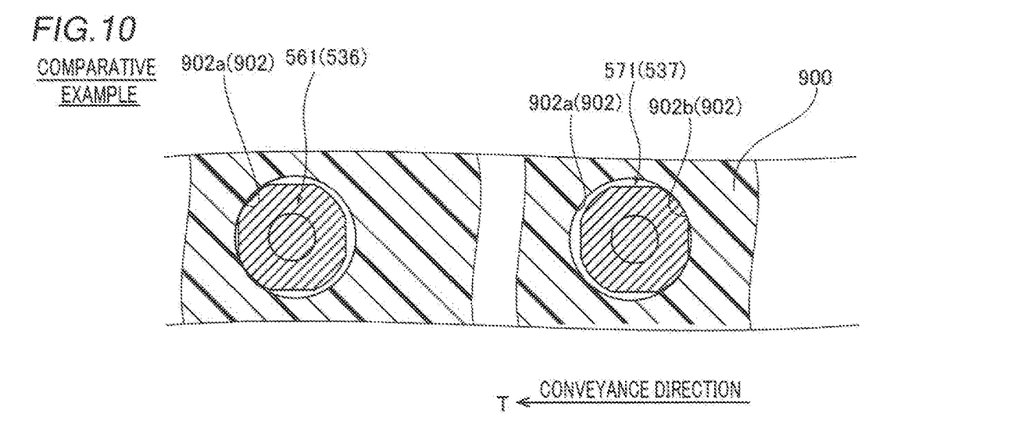
FIG. 10 is a first plan view showing a carrier tape that engages with the second sprocket of the feeder according to the comparative example.

FIG. 10 is a plan view showing a second protrusion 571 of the second sprocket 537 in a state where a tape 900 in which a pitch P between tape holes 902 is shorter than a reference value due to an error is conveyed. When the feeder 503a is conveying the tape 900 having the shorter pitch P between the tape holes 902 while positioning a first protrusion 561 of the first sprocket 536 and a tape hole 902, the second protrusion 571 of the second sprocket 537 is in contact with an upstream position 902b of the tape hole 902. The second protrusion 571 and the edge (position 902b) of the tape hole 902 come into contact with each other such that tension acts on the tape 900 between the first protrusion 561 and the second protrusion 571, and the tape 900 is conveyed in a stretched state. Thus, it becomes difficult for the tape 900 to come off from the first sprocket 536, and hence vibration occurs in the tape 900 when the tape 900 comes off from the first sprocket 536. Consequently, components 900a disposed in storages 901 of the tape 900 vibrate such that the accuracy of suctioning the components 900a decreases.

Figure 11:
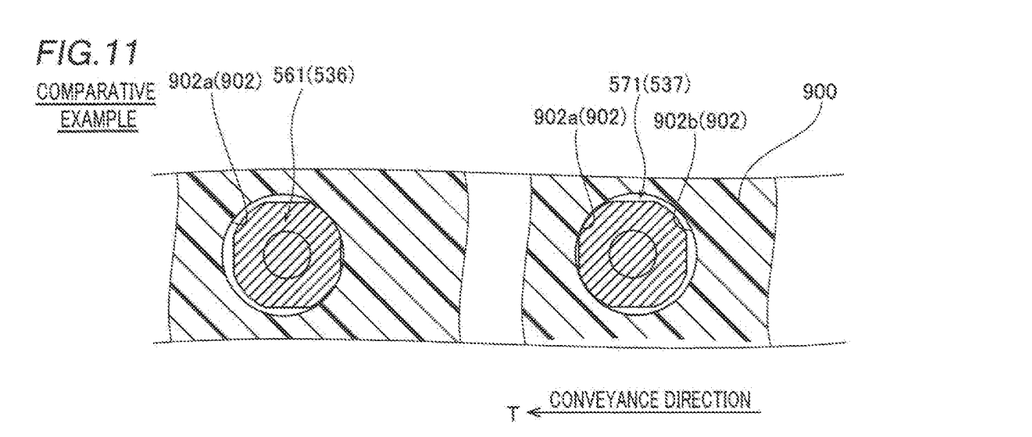
FIG. 11 is a second plan view showing the carrier tape that engages with the second sprocket of the feeder according to the comparative example.

FIG. 11 is a plan view showing the second protrusion 571 of the second sprocket 537 that conveys the tape 900 having the pitch P between the tape holes 902 longer than the reference value due to an error. When the feeder 503a is conveying the tape 900 having the longer pitch P between the tape holes 902 while positioning the first protrusion 561 of the first sprocket 536 and the tape hole 902, the second protrusion 571 of the second sprocket 537 is in contact with a downstream position 902a of the tape hole 902. The second protrusion 571 and the edge (position 902a) of the tape hole 902 come into contact with each other, and hence the tape 900 is conveyed in a pushed (bent) state by the second protrusion 571. Consequently, the accuracy of suctioning the components 900a decreases.

Description of Present Embodiment

On the other hand, according to the present embodiment, the feeder 3a includes the phase adjustment mechanism 38.

Furthermore, the width W2 of the second protrusion 371 of the second sprocket 37 is smaller than the width W1 of the first protrusion 361 of the first sprocket 36. Thus, as shown in FIG. 8, in a state where the feeder 3a conveys the tape 900 while positioning the first protrusion 361 of the first sprocket 36 and the tape hole 902, the space S is ensured between the second protrusion 371 and the edge (the downstream position 902a or the upstream position 902b) of the tape hole 902 even when there is an error in the pitch P between the tape holes 902 (even when the pitch P is shorter or longer than the reference value). Thus, even when there is an error in the pitch P between the adjacent tape holes 902, it is possible to significantly reduce or prevent contact of the second protrusion 371 with the edge of the tape hole 902, and hence the second protrusion 371 does not apply a load to the tape 900. Consequently, it is possible to significantly reduce or prevent failure to properly convey the tape 900 due to stretching or bending of the tape 900.

Modified Examples

The embodiment disclosed this time must be considered as illustrative in all points and not restrictive. The range of the present disclosure is shown not by the above description of the embodiment but by the scope of claims for patent, and all modifications (modified examples) within the meaning and range equivalent to the scope of claims for patent are further included.

For example, while the example in which the phase adjustment mechanism 38 is provided, and in the conveyance direction, the width of the second protrusion 371 of the second sprocket 37 is smaller than the width of the first protrusion 361 of the first sprocket 36 has been shown in the aforementioned embodiment, the present disclosure is not restricted to this. According to the present disclosure, in the conveyance direction, the width of the second protrusion 371 of the second sprocket 37 may not be smaller than the width of the first protrusion 361 of the first sprocket 36 as long as the phase adjustment mechanism 38 is provided. Even if the width of the second protrusion 371 is the same as the width of the first protrusion 361, a pitch error between the tape holes 902 can be adjusted. In addition, when there is a machining error in a dimension such as the formation position of the second protrusions 371 with respect to the second sprocket 37, the phase adjustment mechanism 38 can be adjusted to align the phase position. Furthermore, when it is intended to accurately position and fix the phase of the second sprocket 37 in the rotation direction by only the machining accuracy of fitting portions of the second sprocket 37 and its mounting target, accuracy management in machining is very difficult, but the presence of the phase adjustment mechanism 38 makes it possible to easily align and fix the phase by adjustment.

While the example in which the second sprocket 37 is fixed to the fixing plate 390 has been shown in the aforementioned embodiment, the present disclosure is not restricted to this. According to the present disclosure, the fixing plate 390 may not be provided. The second sprocket 37 may be directly fixed to the power transmission gear 380. In this case, a mechanism that adjusts the rotation phase of the second sprocket 37 with respect to the power transmission gear 380 can be provided in the power transmission gear 380.

While the example in which the second sprocket 37 is disposed between the fixing plate 390 and the power transmission gear 380 has been shown in the aforementioned embodiment, the present disclosure is not restricted to this.

According to the present disclosure, the second sprocket 37 may be disposed at a position different from the position between the fixing plate 390 and the power transmission gear 380.

While the example in which the second sprocket 37 is fixed to the fixing plate 390 by the fastening members 400b has been shown in the aforementioned embodiment, the present disclosure is not restricted to this. According to the present disclosure, the second sprocket 37 may be fixed to the fixing plate 390 by members other than the fastening members 400b.

While the example in which the components 900a are exposed on the upper surface by tearing the film 903 at the central portion of the tape 900 in the direction perpendicular to the conveyance direction by the component exposure portion 40 has been shown in the aforementioned embodiment, the present disclosure is not restricted to this. According to the present disclosure, the components 900a may be exposed on the upper surface by peeling the film 903 without providing the component exposure portion 40.

Furthermore, instead of providing the component exposure portion 40 that cuts the film 903 at the central portion, one of both sides of the tape 900 through the storages 901, on which the film 903 is stuck, may be peeled off, the other side may remain to be stuck, and the film 903 may be rolled up to expose the components 900a. That is, the film 903 adheres to the tape 900 along the conveyance direction of the tape 900 on both sides through the storages 901 in the direction perpendicular to the conveyance direction of the tape 900 such that the components 900a are sealed, and the present disclosure is applicable to various structures in which the film 903 is removed from the upper side of the components 900a to expose the components 900a. When the tape 900 is loaded on the feeder 3a, the tape 900 that has been conveyed from the sprocket 33 to the second sprocket 37 is first conveyed, by the second sprocket 37, to a position where a component 900a is exposed by the component exposure portion 40. That is, the tape 900 is fed while the second protrusion 371 comes into contact with the downstream inner wall of the tape hole 902. In the component exposure portion 40, a load is applied to the tape 900 being conveyed due to processing for exposing the components, such as cutting of the tape 900, but the second sprocket 37 is disposed relatively close to the component exposure portion 40 so as not to buckle (bend) a weak tape 900 due to this load. If there is no danger of buckling, the second sprocket 37 may be spaced apart from the component exposure portion 40, but it is necessary to place the second sprocket 37 upstream of the component exposure portion 40 in the conveyance direction in order to introduce the tape 900 into the component exposure portion 40. After passing through the component exposure portion 40, the tape 900 is conveyed by the second sprocket 37 until the tape 900 engages with the first sprocket 36. When engaging with the first sprocket 36, the tape 900 is conveyed initiatively by the first sprocket 36. That is, although the second sprocket 37 rotates at the same rotational speed as that of the first sprocket 36, the second sprocket 37 does not engage with the tape 900 and rotates passively as described above. The second sprocket is needed to convey the tape 900 to the first sprocket 36 when the tape 900 is loaded, and the first sprocket 36 moves the tape 900 intermittently to accurately position the exposed component 900a at the suction position B. The first sprocket 36 is located at a position where the tape 900 that passes through the component exposure portion 40 is pulled, and hence it is possible to prevent the tape 900 from being bent and buckled at the component exposure portion 40.

While the example in which the vertical section of the second protrusion 371 of the second sprocket 37 along the conveyance direction is schematically bullet-like has been shown in the aforementioned embodiment, the present disclosure is not restricted to this. According to the present disclosure, the vertical section of the second protrusion 371 of the second sprocket 37 along the conveyance direction may be triangular, a rectangular, a trapezoidal or the like.

While the example in which the second protrusion 371 has a rectangular horizontal sectional shape has been shown in the aforementioned embodiment, the present disclosure is not restricted to this. According to the present disclosure, the second protrusion 371 may have a horizontal sectional shape other than a rectangle.

What is claimed is:

1. A feeder that conveys a carrier tape including a component in a predetermined conveyance direction, comprising:
    a first sprocket disposed downstream in the conveyance direction and including a first protrusion configured to engage with the carrier tape;
    a second sprocket disposed upstream in the conveyance direction, including a second protrusion configured to engage with the carrier tape, and configured to rotate in synchronization with the first sprocket;
    a phase adjuster configured to adjust a phase of the second sprocket around a rotation center of the second sprocket; and
    a drive configured to drive the first sprocket and the second sprocket commonly, wherein
    the phase adjuster is provided with respect only to the second sprocket,
    the phase adjuster includes a power transmission gear configured to transmit a drive force from the drive to the second sprocket disposed upstream in the conveyance direction, and
    the second sprocket is rotationally movable with respect to the power transmission gear.
2. The feeder according to claim 1, wherein:
    in the conveyance direction, a width of the second protrusion of the second sprocket is smaller than a width of the first protrusion of the first sprocket.
3. The feeder according to claim 1, wherein:
    the phase adjuster includes a fixing plate, and
    the fixing plate is fixed to the power transmission gear and fixes the second sprocket such that the second sprocket is rotationally movable around the rotation center.
4. The feeder according to claim 3, wherein:
    the second sprocket is disposed between the fixing plate and the power transmission gear.
5. The feeder according to claim 4, wherein:
    the power transmission gear includes a rotating shaft serving as a rotation center of the power transmission gear,
    the second sprocket includes a hole through which the rotating shaft of the power transmission gear passes, and
    the fixing plate is fixed to the rotating shaft of the power transmission gear.
6. The feeder according to claim 3, wherein:
    the fixing plate includes a long hole having an elongated shape and circumferentially disposed,
    the second sprocket includes a fastening hole circumferentially disposed, and the second sprocket is rotationally movably fixed to the fixing plate by fastening a fastening member, which has passed through the long hole, to the fastening hole.

7. The feeder according to claim 6, wherein:
the long hole includes an arcuate hole.

8. A component mounting device comprising:
a feeder including a first sprocket disposed downstream in a conveyance direction in which a carrier tape including a component is conveyed and including a first protrusion configured to engage with the carrier tape, a second sprocket disposed upstream in the conveyance direction, including a second protrusion configured to engage with the carrier tape, and that rotates in synchronization with the first sprocket, a phase adjuster configured to adjust a phase of the second sprocket around a rotation center of the second sprocket, and a drive configured to drive the first sprocket and the second sprocket commonly; and
a mounter configured to mount the component on a mounting target,
wherein
the phase adjuster is provided with respect only to the second sprocket,
the phase adjuster includes a power transmission gear configured to transmit a drive force from the drive to the second sprocket disposed upstream in the conveyance direction, and
the second sprocket is rotationally movable with respect to the power transmission gear.

9. The feeder according to claim 8, wherein:
the phase adjuster includes a fixing plate, and
the fixing plate is fixed to the power transmission gear and fixes the second sprocket such that the second sprocket is rotationally movable around the rotation center.

10. The feeder according to claim 9, wherein:
the second sprocket is disposed between the fixing plate and the power transmission gear.

11. The feeder according to claim 10, wherein:
the power transmission gear includes a rotating shaft serving as a rotation center of the power transmission gear,
the second sprocket includes a hole through which the rotating shaft of the power transmission gear passes, and
the fixing plate is fixed to the rotating shaft of the power transmission gear.

12. The feeder according to claim 9, wherein:
the fixing plate includes a long hole having an elongated shape and circumferentially disposed,
the second sprocket includes a fastening hole circumferentially disposed, and
the second sprocket is rotationally movably fixed to the fixing plate by fastening a fastening member, which has passed through the long hole, to the fastening hole.

13. The feeder according to claim 12, wherein:
the long hole includes an arcuate hole.

14. The feeder according to claim 10, wherein:
the fixing plate includes a long hole having an elongated shape and circumferentially disposed,
the second sprocket includes a fastening hole circumferentially disposed, and
the second sprocket is rotationally movably fixed to the fixing plate by fastening a fastening member, which has passed through the long hole, to the fastening hole.

15. The feeder according to claim 14, wherein:
the long hole includes an arcuate hole.

16. The feeder according to claim 11, wherein:
the fixing plate includes a long hole having an elongated shape and circumferentially disposed,
the second sprocket includes a fastening hole circumferentially disposed, and
the second sprocket is rotationally movably fixed to the fixing plate by fastening a fastening member, which has passed through the long hole, to the fastening hole.

17. The feeder according to claim 16, wherein:
the long hole includes an arcuate hole.

* * * * *